(12) United States Patent
Chang et al.

(10) Patent No.: US 8,736,294 B2
(45) Date of Patent: May 27, 2014

(54) PROBE CARD STIFFENER WITH DECOUPLING

(75) Inventors: Kevin S. Chang, San Francisco, CA (US); Eric D. Hobbs, Livermore, CA (US)

(73) Assignee: FormFactor, Inc., Livermore, CA (US)

( * ) Notice: Subject to any disclaimer, the term of this patent is extended or adjusted under 35 U.S.C. 154(b) by 492 days.

(21) Appl. No.: 12/967,302

(22) Filed: Dec. 14, 2010

(65) Prior Publication Data
US 2012/0146679 A1 Jun. 14, 2012

(51) Int. Cl.
*G01R 31/00* (2006.01)

(52) U.S. Cl.
USPC .................................... 324/756.03

(58) Field of Classification Search
USPC .................................... 324/756.03
See application file for complete search history.

(56) References Cited

U.S. PATENT DOCUMENTS

| | | | |
|---|---|---|---|
| 7,285,968 B2 * | 10/2007 | Eldridge et al. | ......... 324/750.03 |
| 7,592,821 B2 | 9/2009 | Eldridge et al. | |
| 7,622,935 B2 | 11/2009 | Hobbs et al. | |
| 7,688,063 B2 | 3/2010 | McFarland et al. | |
| 7,772,863 B2 | 8/2010 | Breinlinger et al. | |
| 7,956,635 B2 | 6/2011 | Hobbs et al. | |
| 8,120,373 B2 | 2/2012 | Hobbs et al. | |
| 2006/0001440 A1 * | 1/2006 | Martens et al. | ................ 324/754 |
| 2006/0255814 A1 * | 11/2006 | Eldridge et al. | ............... 324/754 |
| 2006/0290367 A1 * | 12/2006 | Hobbs et al. | ................... 324/763 |
| 2007/0126440 A1 * | 6/2007 | Hobbs et al. | ................... 324/754 |
| 2008/0042668 A1 * | 2/2008 | Eldridge et al. | ............... 324/754 |
| 2008/0157791 A1 * | 7/2008 | Hobbs et al. | ................... 324/754 |
| 2008/0186040 A1 * | 8/2008 | Hobbs et al. | ................... 324/760 |
| 2008/0203268 A1 * | 8/2008 | Hobbs et al. | ................... 248/678 |
| 2008/0231258 A1 | 9/2008 | Hobbs et al. | |
| 2008/0303540 A1 * | 12/2008 | Stiefvater et al. | .............. 324/754 |
| 2009/0079452 A1 * | 3/2009 | Eldridge et al. | ............... 324/758 |
| 2009/0108861 A1 * | 4/2009 | Hobbs et al. | ................... 324/758 |
| 2009/0206860 A1 * | 8/2009 | McFarland et al. | ........... 324/758 |
| 2009/0230981 A1 * | 9/2009 | Yasumura et al. | ............. 324/754 |
| 2010/0026331 A1 | 2/2010 | Chong et al. | |
| 2010/0127726 A1 | 5/2010 | Yoshihiro et al. | |
| 2012/0212248 A9 * | 8/2012 | Chong et al. | ............. 324/754.07 |

OTHER PUBLICATIONS

International Search Report, PCT/US2011/063889 (Jul. 11, 2012), 3 pages.
Written Opinion of the International Searching Authority, PCT/US2011/063889 (Jul. 10, 2012), 5 pages.

* cited by examiner

Primary Examiner — Jermele M Hollington
Assistant Examiner — Demetrius Pretlow
(74) Attorney, Agent, or Firm — Kirton McConkie

(57) ABSTRACT

A stiffener for a probe card assembly can include decoupling mechanisms disposed within radial arms of the stiffener. The decoupling mechanisms can be compliant in a direction along a radial direction of said radial arm and rigid in a direction perpendicular to said radial arm. The decoupling mechanisms can decouple the stiffener from thermally induced differential radial contraction and expansion of the stiffener relative to the cardholder to which the stiffener is mounted. This can reduce thermally-induced vertical translation of the probe card assembly.

26 Claims, 8 Drawing Sheets

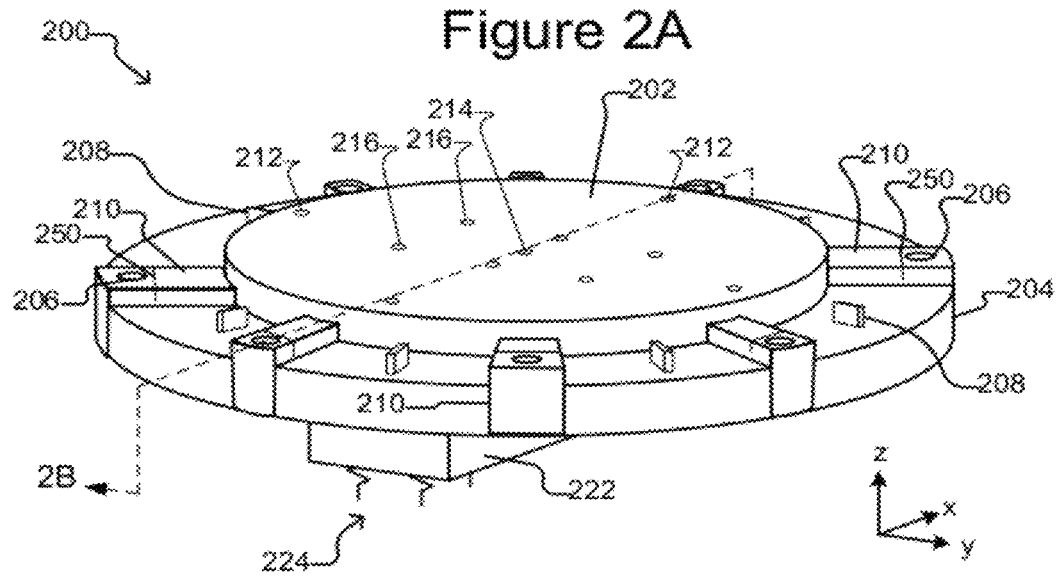
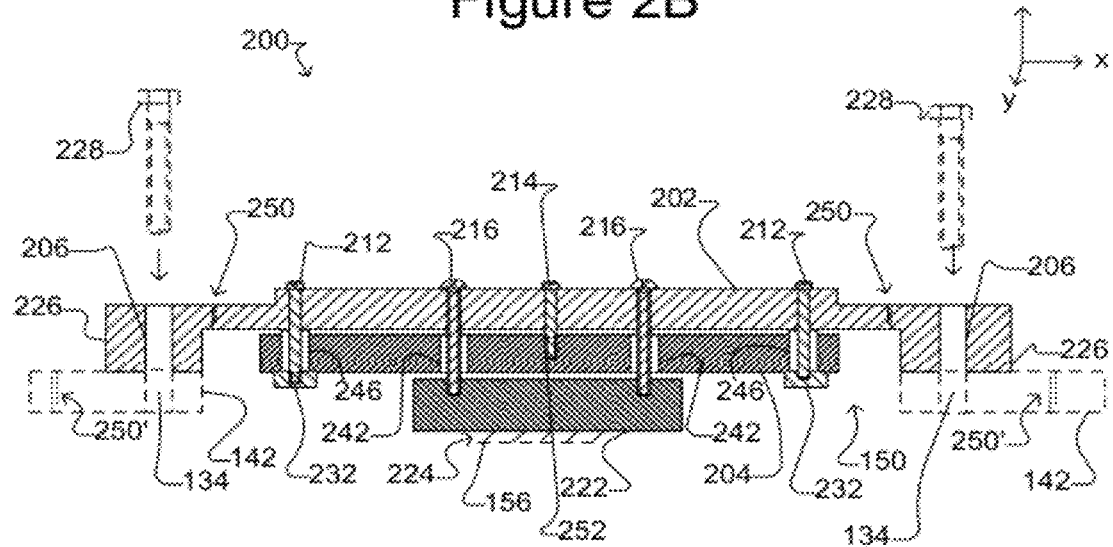

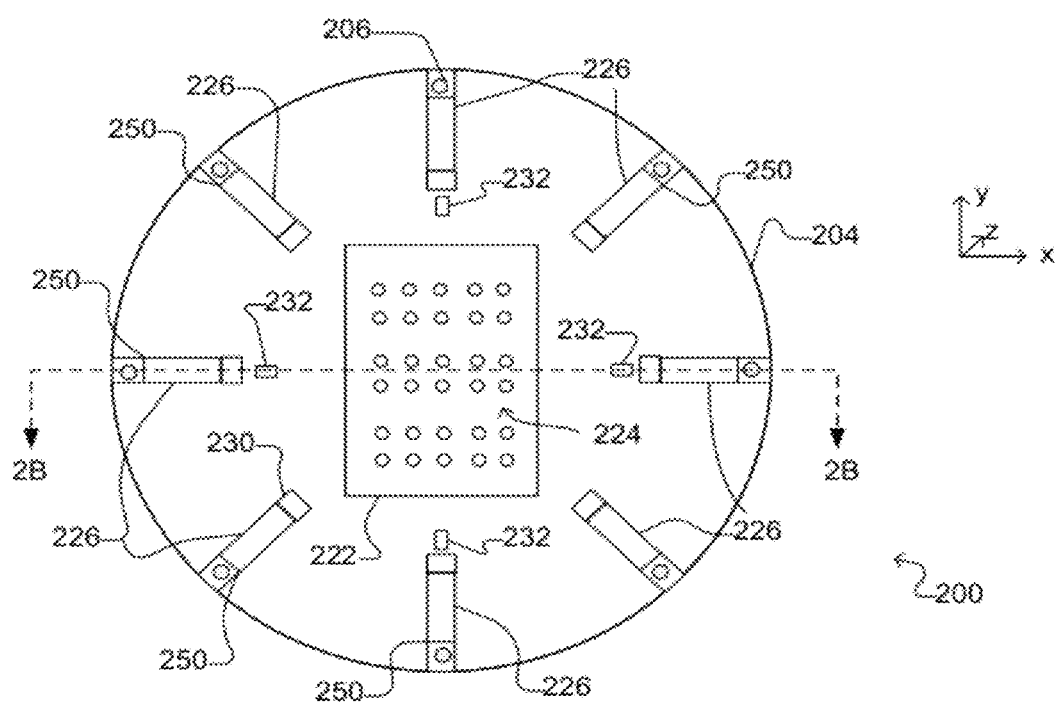

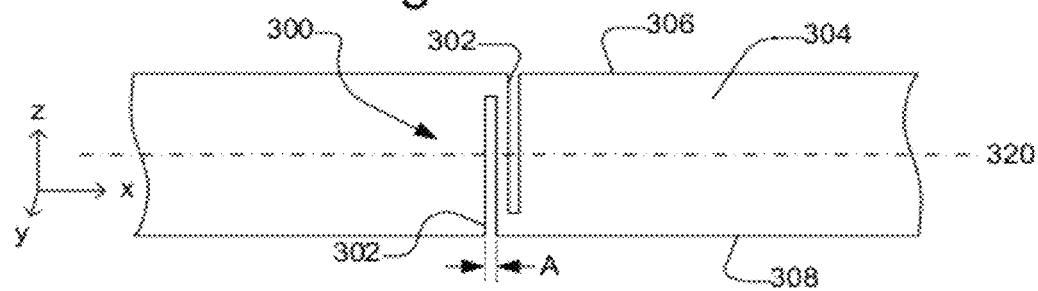
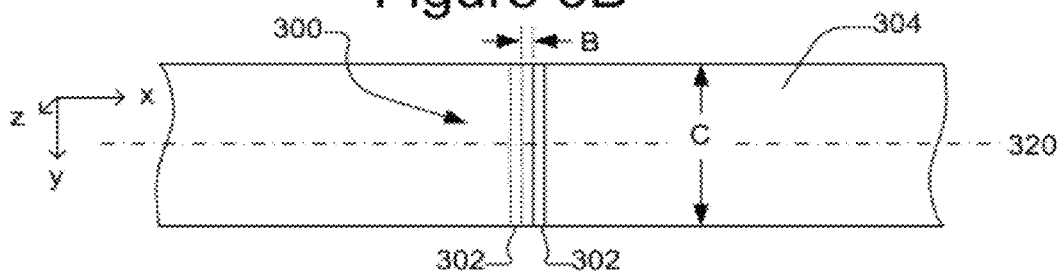

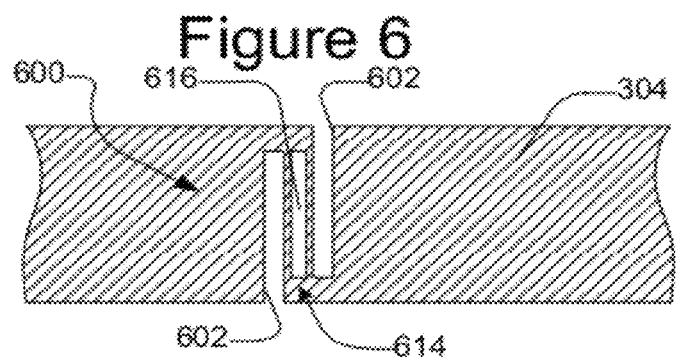
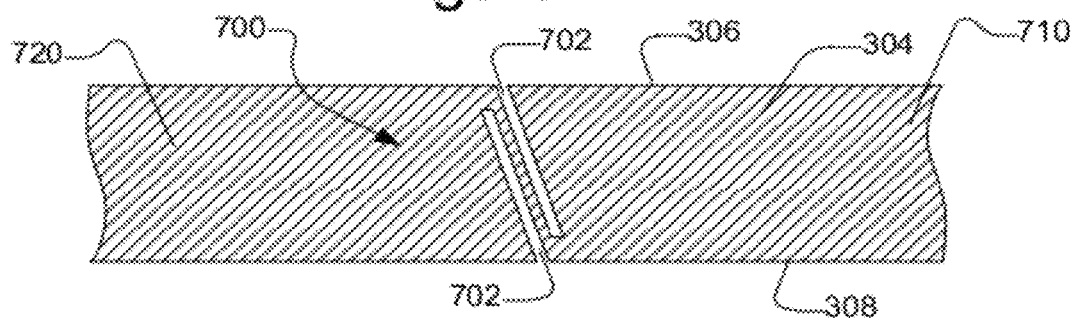

PROBE CARD STIFFENER WITH DECOUPLING

BACKGROUND

Microelectronic devices (e.g. dies) are typically manufactured in large number on a semiconductor wafer. For various reasons, the devices may fail to perform correctly. Accordingly, as a part of the manufacturing process, various tests of the microelectronic devices are typically performed. Tests can include, for example, functional tests, speed tests and sorting, and burn-in testing. Testing can be performed at the wafer level (e.g., before the microelectronic devices are separated from each other in a process called singulation) to allow failed to devices to be identified before packaging the devices.

To perform tests on the microelectronic devices, temporary electrical connections to the devices are made. For example, a wafer can be placed into a prober, and the wafer placed onto a movable stage. The stage can be moved to bring the wafer into contact with a probe card assembly. The probe card assembly can include many probes that are arranged to make temporary pressure-based electrical contacts to corresponding terminals (e.g., aluminum bond pads) on the microelectronic devices. Alignment of the wafer and probe card assembly can be performed using optical systems. Testing can involve sending signals to and from the wafer through the probes.

Because of the small sizes of the terminals and probes, it is challenging to ensure and maintain proper alignment between the probe card assembly and the wafer. Typically, the probe card assembly is mounted (e.g., bolted or otherwise fixed in position) into the prober to maintain a fixed position of the probe card assembly relative to the stage. Various adjustment mechanisms can be provided in the prober, probe card assembly, or both to allow alignment operations (e.g., tilt adjust) to be performed to place the tips of the probes into parallel alignment with the surface of the stage (and thus, into alignment with terminals of the wafer).

Maintaining proper alignment can be complicated when temperature variations are present, as most materials change dimension as a function of temperature. It is often advantageous to test the microelectronic devices over a range of temperatures. To this end, heating or cooling elements can be included in the stage or other portions of the prober to heat or cool the microelectronic devices during testing. Moreover, even if heating or cooling elements are not included, operation of the microelectronic devices during testing may generate heat. The resultant heating or cooling can cause the wafer, probe card assembly, and the prober to expand or contract, changing the positions of the probes relative to the terminals. For example, differential changes in the dimension of the probe card assembly relative to the mounting structure (e.g., cardholder) of the prober to which the probe card assembly is mounted can cause bowing or bending of the probe card assembly. If the bowing is toward the stage, one or more of the probes may press against the electronic devices with too much force and damage the devices or the probes. Conversely, if the bowing is away from the stage, one or more of the probes may fail to make reliable electrical contact with the terminals of the electronic devices, resulting in erroneous test results.

SUMMARY

In some embodiments of the invention, a probe card assembly is provided. The probe card assembly can include a wiring substrate. The wiring substrate can have internal electrical traces which connect to a tester interface disposed on a first surface of the wiring substrate. A probe head having a plurality of probes can be disposed proximate to a second surface of the wiring substrate and can include electrical connections between the probes and the internal electrical traces of the wiring substrate. The probes can be arranged to contact an electronic device to be tested. A stiffener can be disposed proximate to the first surface. The stiffener can have a plurality of attachment mechanisms disposed distally from the main body. A plurality of decoupling mechanisms can be disposed between the main body and the attachment mechanisms. The decoupling mechanism can be compliant in a radial direction and rigid in one or more other directions.

In some embodiments of the invention a stiffener is provided. The stiffener can include a main body portion and a plurality of radial arms disposed within a plane and extending radially outward from the main body portion. The main body portion can include first attachment mechanisms positioned for attachment to a probe card substrate. The radial arms can include second attachment mechanisms for attachment to a cardholder of a prober. A decoupling mechanism can be disposed within each of the arms between the main body portion and the second attachment mechanism. The decoupling mechanism can accommodate movement in a radial direction along a radial axis of the arm, and can resist movement in one or more directions perpendicular to the plane.

In some embodiments of the invention a method of using a probe card assembly is provided. The method can include obtaining a probe card assembly. The probe card assembly can include a probe head having resilient probes, a stiffener having a main body coupled to the probe head and a plurality of radial arms extending radially outward from the main body in an x-y plane. A decoupling mechanism can be disposed within each radial arm between the main body and an attachment mechanism disposed at the end of the radial arm distal from the main body. The method can also include installing the probe card assembly into a prober. The installing can include fixing the attachment mechanisms to a cardholder of the prober. Another operation in the method can be varying a temperature of the probe card assembly such that a radial dimensional change of the probe card assembly occurs relative to the cardholder. The decoupling mechanisms can respond to the radial dimensional change to maintain a substantially constant position of the main body relative to the cardholder in a z direction perpendicular to the x-y plane.

BRIEF DESCRIPTION OF THE DRAWINGS

FIG. 2A illustrates perspective view of another arrangement of a probe card assembly according to some embodiments of the invention.

FIG. 2B is a side cross section view of the probe card assembly of FIG. 2A.

FIG. 2D is a bottom view of the probe card assembly of FIGS. 2A-2C.

FIG. 3A is a side view of a portion of a radial arm showing an example of a decoupling mechanism according to some embodiments of the invention.

FIG. 3B is a top view of the decoupling mechanism of FIG. 3A.

FIG. 6 is a side cross-section view of a radial arm showing another example of a decoupling mechanism according to some embodiments of the invention.

FIG. 7 is a side cross-section view of a radial arm showing another example of a decoupling mechanism according to some embodiments of the invention.

DETAILED DESCRIPTION OF EXEMPLARY EMBODIMENTS

This specification describes exemplary embodiments and applications of the invention. The invention, however, is not limited to these exemplary embodiments and applications or to the manner in which the exemplary embodiments and applications operate or are described herein. Moreover, the Figures may show simplified or partial views, and the dimensions of elements in the Figures may be exaggerated or otherwise not in proportion for clarity. In addition, as the terms "on," "attached to," or "coupled to" are used herein, one object (e.g., a material, a layer, a substrate, etc.) can be "on," "attached to," or "coupled to" another object regardless of whether the one object is directly on or attached to or coupled to the other object or there are one or more intervening objects between the one object and the other object. Also, directions (e.g., above, below, top, bottom, side, up, down, under, over, upper, lower, horizontal, vertical, "x," "y," "z," etc.), if provided, are relative and provided solely by way of example and for ease of illustration and discussion and not by way of limitation. In some figures, "x," "y," and "z" axes are provided in accordance with a right-hand coordinate system for ease of discussion and illustration but not by way of limitation. With reference to particular directions or orientations, the term "substantially" may be used, by which it is to be understood that the recited direction or orientation need not be exact, but may include deviations or variations, including for example, tolerances, measurement error, measurement accuracy limitations, conversion factors, rounding off, and other factors known to skill in the art. Similarly, the term "about" means quantities, dimensions, sizes, formulations, parameters, shapes and other characteristics need not be exact, but may be approximated and/or larger or smaller, as desired, reflecting acceptable tolerances, conversion factors, rounding off, measurement error and the like and other factors known to those of skill in the art. In addition, where reference is made to a list of elements (e.g., elements a, b, c), such reference is intended to include any one of the listed elements by itself, any combination of less than all of the listed elements, and/or a combination of all of the listed elements. In addition, where reference is made to a range of values, such reference is intended to include not only the explicitly recited range, but also all the individual values and sub-ranges encompassed within that range.

Figure 1A:
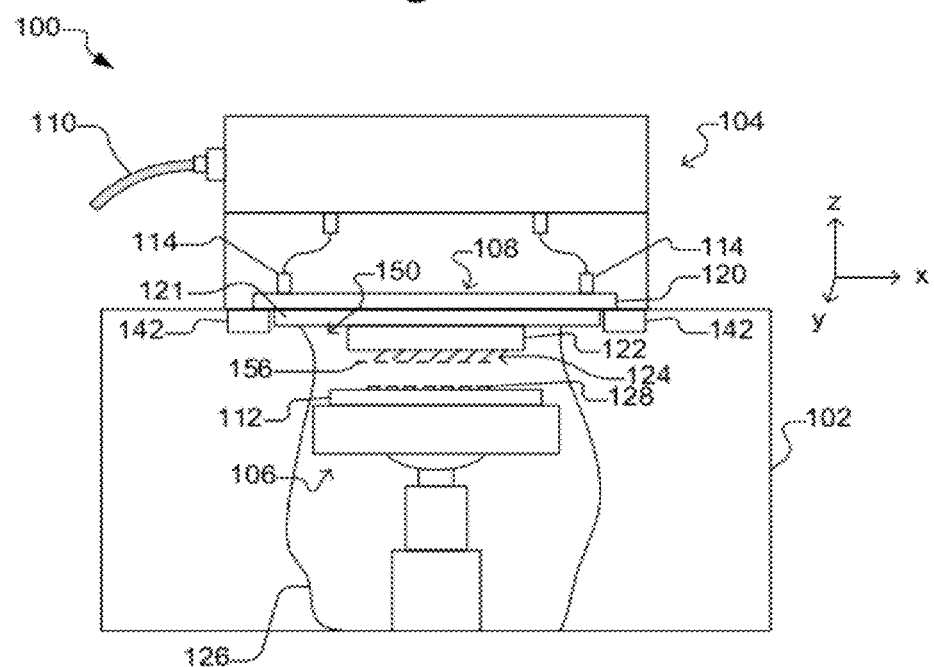
FIG. 1A illustrates a side view of a test system according to some embodiments of the invention.
Figure 1B:
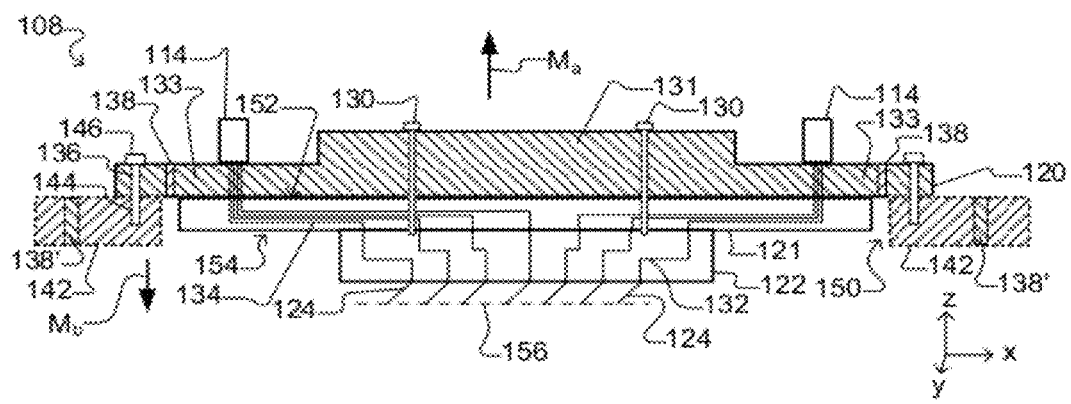
FIG. 1B illustrates a detailed cross-section side view of the probe card assembly of the test system of FIG. 1A according to some embodiments of the invention.

FIGS. 1A-1B illustrates a schematic side view depiction of a test system, shown generally at 100, which can address some of the aforementioned challenges. Referring to FIG. 1A, the test system 100 can include a prober 102 and a test head 104. A cutaway 126 provides a partial view of the inside of the prober 102. A device to be tested, referred to herewith as a device under test (DUT) 112, can be placed onto a stage 106. The DUT can be for example: a microelectronic device, a wafer comprising a plurality of unsingulated dies, a carrier holding a wafer, a carrier holding a plurality of singulated dies, dies forming a multi-chip module, and the like. The stage can be movable to position the DUT 112 in a horizontal plane (e.g., directions labeled "x" going left and right across the page and "y" going in and out of the page) and a vertical direction (e.g., direction labeled "z" going up and down the page). A probe card assembly 108 can be mounted into the prober 102 and can include probes 124. The probes 124 can be arranged in a pattern which corresponds to terminals 128 of the DUT 112. For example, as shown in FIGS. 1A and 1B, contact portions (e.g., distal ends) of the probes 124 can be disposed generally in a plane 156 that corresponds to a plane (not shown) of terminals 128 of the DUT 112. The stage can be moved vertically to bring the probes 124 into contact with the terminals 128 to form temporary pressure electrical connections between the probes and the terminals. Testing can include exchanging electrical signals between the DUT 112 and the test head 104 through the probes 124 and terminals 128. For example, test signals can be sourced and sinked from a tester (not shown) which connects to the test head 104 through a cable 110. Alternatively or in addition, test signals can be sourced and sinked from the test head 104 using electronics (not shown) in the test head. As another example, electronics (not shown) of the probe card assembly 108 can source or sink test signals or perform processing (e.g., conversion) of test signals.

The probe card assembly 108 can include a stiffener 120, wiring substrate 121, and probe head 122. The wiring substrate 121 can be, for example a printed circuit board material, and can include multiple layers (not shown) of an insulating material on which conductive traces (not shown) are formed thereon and vias (not shown) are formed between to provide electrical connections. For example, the wiring substrate 121 can comprise a ceramic, organic, or printed circuit board substrate comprising electrically conductive pads (not shown) on one surface of the substrate and internal conductive paths connecting those pads to terminals (not shown) on another surface of the substrate. As shown in detail in FIG. 1B, the wiring substrate 121 can have a first, upper surface 152 and a second, lower surface 154 opposite the first surface. The stiffener 120 can be disposed opposite the first surface 152 and the probe head 122 can be disposed opposite the second surface 154, although other arrangements are possible. The probes 124 can be disposed on the probe head 122.

The probe head can include one or more substrates (e.g., printed circuit boards, organic layers, ceramic layers, and the like, similar to the wiring substrate 121) on which the probes are mounted (e.g., to conductive terminals). The probe head 122 can be coupled to the stiffener 120, for example as described further below.

The stiffener 120 can be plate-like rigid structure and can include a rigid material (e.g., metal) which resists warping or bending due to mechanical loads or thermal gradients. The stiffener 120 can be a monolithic assembly, or the stiffener can be assembled from a number of components. For example, the stiffener 120 can be machined or cast in a single body. Alternatively, the stiffener can include a main body portion and one or more arms which are attached to the main body portion. In some embodiments, the stiffener 120 can be made of aluminum, steel (e.g., stainless steel), titanium, nickel, low-CTE nickel-steel alloys (e.g., Invar material, nickel-cobalt ferrous alloys (e.g., to match particular CTE requirements, e.g. Kovar material)), graphite epoxy, metal matrix materials, ceramics, etc. In addition, alloys of any of the foregoing materials or mixtures of any of the foregoing materials with other materials can be used. The stiffener can be more rigid than the wiring substrate 121, the probe head 122, or both, and thus can provide structural rigidity to the probe card assembly 108. The probe head 122 can be coupled to the stiffener 120 so that forces applied to the probe head are passed through to the stiffener, helping to provide rigidity to the probe head. For example, attachment mechanisms 130 can connect the probe head 122 to the stiffener 120. For example, the attachment mechanisms can be fasteners that fix the probe head 122 in position relative to the stiffener. As another example, the attachment mechanisms can be adjustment mechanisms to allow for adjustment of the planarity and orientation of the probe head. For example, adjustment mechanisms can include differential screws, biasing springs, actuators, and similar components.

One non-limiting example of an attachment and adjustment mechanism for coupling a probe head to a stiffener is illustrated in U.S. Pat. No. 7,671,614. Other intermediate assemblies (not shown), such as for example, one or more interposers and/or space transformers can also be included between the wiring substrate 121 and the probe head 122. While only a single probe head 122 is illustrated, more than one probe head can be included if desired. Non-limiting examples of probe head assemblies and attachment and adjustment techniques are disclosed in U.S. Pat. Nos. 5,974,662, 6,483,328, 6,509,751, 5,806,181, 6,690,185, 6,640,415, Application Publication No. 2001/0054905, U.S. Patent Application Publication No. 2002/0004320, U.S. Patent Application Publication No. 2002/0132501 and U.S. patent application Ser. No. 11/165,833, entitled "Method And Apparatus For Adjusting A Multi-Substrate Probe Structure," filed Jun. 24, 2005.

The probes 124 can be resilient and can include an electrically-conductive material to allow an electronic signal to be transmitted through the probe. Non-limiting examples of probes 112 include composite structures formed of a core wire bonded to a conductive terminal (not shown) on the probe head 122 that is over coated with a resilient material as described in U.S. Pat. Nos. 5,476,211, 5,917,707, 6,336,269. Probes 124 can alternatively be lithographically formed structures, such as the spring elements disclosed in U.S. Pat. Nos. 5,994,152, 6,033,935, 6,255,126, 6,945,827, U.S. Patent Application Publication No. 2001/0044225, and U.S. Patent Application Publication No. 2004/0016119. Still other non-limiting examples of probes are disclosed in U.S. Pat. Nos. 6,827,584, 6,640,432, 6,441,315, and U.S. Patent Application Publication No. 2001/0012739. Other non-limiting examples of probes 124 include conductive pogo pins, bumps, studs, stamped springs, needles, buckling beams, etc.

On or within the probe head 122, electrical connections 132 (e.g., traces, vias, or both) can electrically connect the probes 124 to electrical connections 134 (e.g., traces, vias, or both) on or within the wiring substrate 121, which can electrically connect to test connectors 114, which can be electrically connected to the test head 104. The test connectors 114 can be, for example, zero insertion force connectors, pogo pins, flexible wiring, and the like. The test connectors 114 can extend from the wiring substrate 121 upward between radial arms 133 of the stiffener 120, or upward through holes (not shown) in the stiffener 120. Alternatively, or in addition, the electrical connections 134 can connect to electronic circuitry (not shown) disposed on the wiring substrate 121. The electrical connections 132, 134 and probes 124 can thus provide electrical signal paths which can be used by the tester (not shown), test head 104, and/or circuitry (not shown) to write test data to and receive response data from the DUT 112. The wiring substrate 121 can be fixedly attached to the stiffener 120, or can float between the stiffener 120 and the probe head 122. For example, the wiring substrate 121 can be mechanically coupled to, but radially decoupled from, the stiffener 120. Non-limiting examples of wiring substrates and attachment techniques are disclosed in U.S. Pat. No. 7,285,968 and U.S. Patent Pub. No. 2007/0126440.

The probe card assembly 108 can be mounted into the prober 102 by fixing the probe card assembly to a cardholder 142 (e.g., a head plate or insert ring) of the prober. For example, the stiffener 120 and the cardholder 142 can each include holes 136, 144 to receive fasteners 146 (e.g., screws, bolts, and the like) used to secure the probe card assembly 108 in place. Other techniques can be used to secure the probe card assembly 108 in position, including for example, clamping and the like. Holes 136 are therefore just one non-limiting example of an attachment mechanism that can be included in the probe card assembly 108, and other attachment mechanisms, including clamping surfaces, screws, mechanical interlocks, and the like can be used. As illustrated in FIGS. 1A, 1B, and 2B, the cardholder 142 can comprise a structure with a central opening 150 into which portions of the probe card assembly 108 extend. For example, the cardholder 142 can comprise a ring structure, and all or part of the wiring substrate 121 and the probe head 122 can be disposed or extend into the opening 150.

As introduced above, most materials change dimension as a function of temperature. Accordingly, temperature changes can cause changes in dimension of the cardholder 142, the probe card assembly 108 (e.g., stiffener 120), or both. For example, differences in the thermal coefficient of expansion (CTE) in the stiffener 120 and the cardholder 142 can result in distance between attachment mechanisms (e.g., holes 136) of the probe card assembly 108 changing relative to the distance between corresponding attachment mechanisms (e.g., holes 144) of the cardholder 142. For example, heating can cause the stiffener 120 to expand a greater amount than the probe cardholder 142, and the resulting mechanical stress can cause the stiffener to bow. Such bowing can be undesirable, as it can result in the probes 124 moving away from a nominal position. Matching the CTE of the stiffener 120 to the cardholder 142 may not be practical due to several factors. For example, some cardholders 142 are made of low CTE material which is very expensive (e.g. made from Nobinite or Invar materials); use of such expensive materials drives up the cost of the probe card assembly. For example, some nickel-iron alloys provide CTE of less than about 1.5 ppm per degree Celsius. In other cases, a probe card user may have different probers which have cardholders made of different materials. As the different cardholders have different CTE, either multiple probe cards (using different materials for the stiffeners) would be needed to avoid CTE mismatches will be present. Moreover, even if the CTE of stiffener 120 and the cardholder 142 are matched, differences in temperature between the stiffener and cardholder can still cause dimensional mismatches.

To reduce movement of the probe card assembly 108 caused by the foregoing effects, the stiffener 120 can include a plurality of decoupling mechanisms 138. For example, the decoupling mechanisms can be disposed within each of radial arm portions 133 of the stiffener. In general, the decoupling mechanisms can be disposed within any portions of a stiffener in a position which allows for decoupling portions of the stiffener 120 from dimensional changes of the cardholder 142. For example, the decoupling mechanisms 138 can be positioned between the attachment mechanisms (e.g., holes 136) and a main body portion 131 of the stiffener 120. Alternatively or in addition, decoupling mechanisms 138' can be provided in the cardholder 142 as also shown in FIG. 1B. Thus, decoupling mechanisms 138' can be used in place of decoupling mechanisms 138 or in addition to decoupling mechanisms 138. Decoupling mechanisms 138' located in the cardholder 142 can be structurally and functionally like decoupling mechanisms 138 and can comprise any embodiment disclosed herein for decoupling mechanisms 138.

Regardless of where located, the decoupling mechanisms 138 can respond to induced forces by changing dimension. For example, the decoupling mechanisms can absorb part or all of the dimensional changes of the stiffener 120 relative to the cardholder 142 to which the stiffener is attached. For example, the decoupling mechanisms 138 can shear in a radial direction (e.g., within the horizontal (x-y) plane) to absorb radial expansion or contraction of the stiffener. For example, the decoupling mechanisms 138 can be compliant in a direction along the radial arm allowing the decoupling mechanism to absorb dimensional changes along the longitudinal axis of the radial arm 133 by expanding or contracting to change the length of the radial arm (e.g., elastically responding to compression or tension along the axis of the radial arm). The decoupling mechanism 138 can maintain rigidity in one or more other directions (e.g., a direction perpendicular to the radial arm to resisting bending or vertical displacement of the radial arm). For example, the decoupling mechanism can be rigid in the z direction, to maintain the rigidity of the stiffener with respect to forces applied to the probes 124. For example, the decoupling mechanism 138 can be compliant in one axis while being rigid in two other axes.

The amount of decoupling is dependent upon the amount of compliance provided by the decoupling mechanism 138, and thus, the decoupling mechanism can be designed to provide a desired amount of decoupling. In some embodiments, the amount of decoupling can be selected to tune the thermally induced stress levels on the probe card assembly 108 and the cardholder 142. Those thermally induced stress levels can result in thermal movement (e.g., deformation and translation vertically (parallel to the "z" axis) in FIGS. 1A, 1B, and 2B) of the stiffener 120 and the cardholder 120, and the amount of decoupling selected for the decoupling mechanism 138 can be such that the total thermal movement of the stiffener 120 and the cardholder 120 result in no appreciable movement of the contact ends of the probes 124 at a given temperature over a predetermined temperature range. The amount of decoupling provided by the decoupling mechanism 138 can thus be tuned, for example, to maintain the contact ends of the probes 124 in a plane (e.g., 156) and to keep the plane (e.g., 156) from appreciably moving even as the temperature changes within a predetermined temperature range.

For example, a given change in temperature may result in a thermal movement $M_a$ of the stiffener 120 and a thermal movement $M_b$ of the cardholder 142. As illustrated in FIG. 1B, movement $M_a$ can be, in this example, in the positive "z" direction, and movement $M_b$ can be in the negative "z" direction. If, for example, $M_a$ is greater than $M_b$, decoupling mechanisms 138, can be configured to allow radial arms 133 to move in the "x,y" plane and thereby reduce movement $M_a$ by approximately the difference between $M_b$ and $M_a$ so that there is no (or no appreciable) movement of plane 156. Alternatively, if decoupling mechanisms 138' are in the cardholder 142, decoupling mechanisms 138' can be configured to increase movement $M_b$ by approximately the difference between $M_b$ and $M_a$ so that there is no (or no appreciable) movement of plane 156.

Various non-limiting detailed examples of decoupling mechanisms are described further below.

Figure 2C:
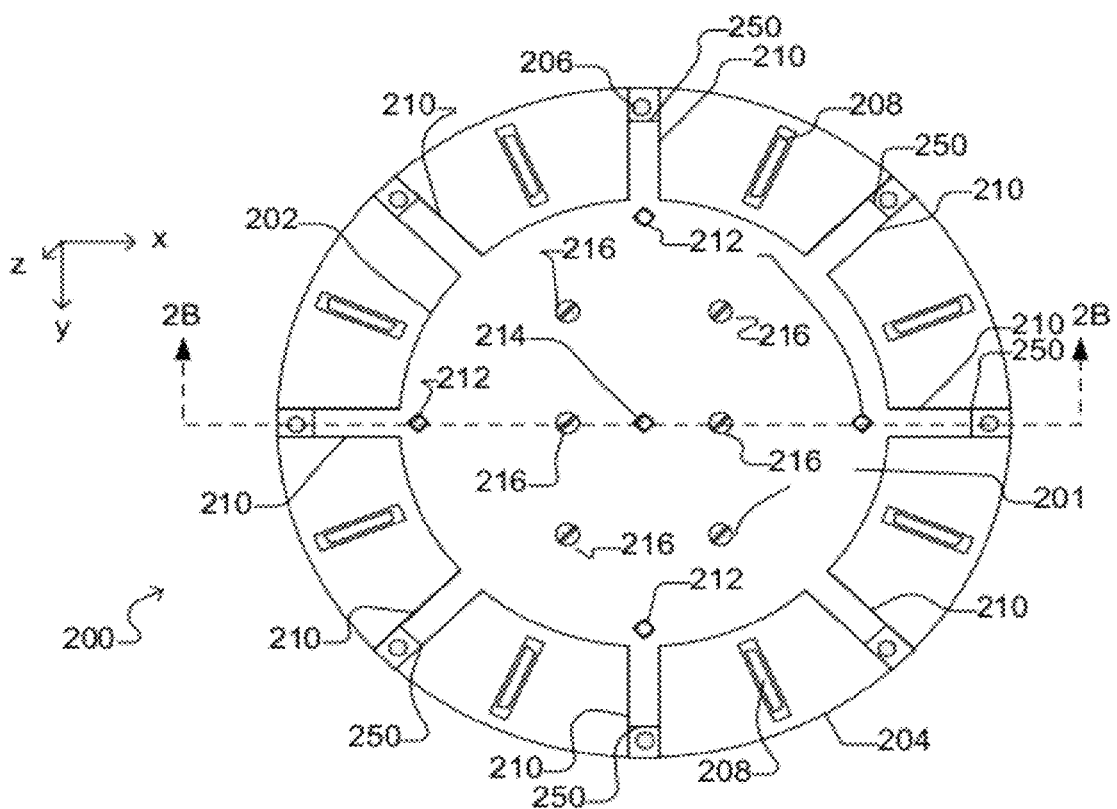
FIG. 2C is a top view of the probe card assembly of FIGS. 2A-2B.

FIGS. 2A-2D illustrate one example of a probe card assembly 200, which can for example be used within the test system 100 of FIG. 1A (e.g., used in place of probe card assembly 108). The probe card assembly 200 can include a stiffener plate 202 (which can be like stiffener 120), a wiring substrate 204 (which can be like wiring substrate 121), and a probe head assembly 222 (which can be like probe head 122). As shown in FIGS. 2B and 2C, the probe head assembly 222 can include a plurality of probes 224 (which can be like probes 124). The wiring substrate 204 can include test head connectors 208 (which can be like test connectors 114). As shown, contact ends of the probes 224 can be in the plane 156 discussed above.

The wiring substrate 204 can be attached to the stiffener plate 202 such that the wiring substrate 204 can expand and contract radially. That is, the wiring substrate 204 can move radially with respect to the stiffener plate 202 and the probe head assembly 222. This can reduce the forces on the stiffener plate 202 caused by expansion or contraction of the wiring substrate 204 in response to changes in the ambient temperature. A mechanical fastener 214 (e.g. a screw or a bolt) can be used to secure the wiring substrate 204 to the stiffener plate 202 at one location (e.g., at the center) of the wiring substrate 204. The fastener 214 can pass through (or thread through) a hole in the stiffener plate 202 and thread into a threaded hole (or insert) 252 in the wiring substrate 204. Additional attachments to the wiring substrate 204 can loosely attach the wiring substrate 204 to the stiffener plate 202 so that it can expand or contract radially relative to the fastener 214. For example, additional fasteners 212, 232 (e.g., bolts and nuts) can prevent the wiring substrate 204 from rotating with respect to the stiffener plate 202. The fasteners 212 can pass through holes 246 in the wiring substrate 204 which are elongate to provide space for expansion and contraction of the wiring substrate 204. Lubrication, bearings, or other means (not shown) can be provided on surfaces of the wiring substrate 204 to facilitate movement of the wiring substrate with respect to the stiffener plate 202 and the probe head assembly 222.

Mechanical fasteners 216 can mechanically attach the probe head assembly 222 to the stiffener plate 202. Mechanical fasteners 216 can thus be a non-limiting example of a plurality of first attachment mechanisms. As shown in FIG. 2C, mechanical fasteners 216 can pass through holes 242 in the wiring substrate 204. Extra space can be provided in the holes 242 in the wiring substrate 204 through which the mechanical fasteners 216 pass. Consequently, the probe head assembly 222 need not be attached directly to the wiring substrate 204. In this way, the wiring substrate 204 can also be thermally decoupled from the probe head assembly 222.

Mechanical fasteners 216 can comprise any suitable means for securing the probe head assembly 222 to the stiffener plate. For example, the mechanical fasteners 216 can be screws or bolts 216 (e.g., as shown in FIG. 2C) that pass through threaded holes (not shown) in the stiffener plate and engage threaded holes (not shown) in the probe head assembly 222. Alternatively, the mechanical fasteners 216 can be more complicated structures that provide additional functions. For example, the mechanical fasteners can be configured not only to secure the probe head assembly 222 to the stiffener plate 202 but also to control the orientation of the probe head assembly 222 (and thus the probes 224) with respect to the stiffener plate 202. Another example of a mechanical fastener 216 is a differential screw.

The stiffener plate 202 can include a main body portion 201 and a plurality of radial arms 210. Although eight radial arms 210 are shown, a larger or smaller number of radial arms can be used. The radial arms 210 can extend radially outward from the main body portion 201 and can be disposed in a plane (e.g., the x-y plane). As can be seen in FIGS. 2B and 2C, the radial arms 210 can include tabs 226 disposed at the ends of the radial arms distal from the main body 201. The tabs 226 can be inserted into corresponding slots in the wiring substrate 204. The slots can include extra clearance space around the tabs to provide thermal decoupling of the stiffener plate 202 and wiring substrate 204. A second attachment mechanism, such as for example holes 206, can be disposed at the ends of the radial arms 210. The holes 206 can correspond to holes 134 in the cardholder 142 so that the probe card assembly 200 can be attached to the cardholder 142 by fasteners 228 (e.g., bolts) that pass through the holes 206 in the radial arms 210 and into or through holes 134 in the cardholder 142 (or tester head plate). In FIG. 2B, the cardholder 142 is shown in dashed lines as are bolt/nut pairs for bolting the probe card assembly 200 to the cardholder 142, since these are not necessarily parts of the probe card assembly. Because the stiffener 202 can be fixed to the cardholder 142 and the probe head assembly 222 can be fixed to the stiffener 202, the stiffener 202 can provide mechanical stability to the probe head assembly 222.

The stiffener 202 can include decoupling mechanisms 250 disposed radially between the main body 201 and the holes 206 to decouple the stiffener from thermally induced movement as described above. For example, the decoupling mechanisms 250 can be disposed within each of the radial arms 210 between the main body 201 and the holes 206. Alternatively or in addition, decoupling mechanisms 250' can be located in the cardholder 142 as also illustrated in FIG. 2B. Thus, decoupling mechanisms 250' can be used in place of decoupling mechanisms 250 or in addition to decoupling mechanisms 250. Regardless of where located, the decoupling mechanisms 250 can, for example, be like decoupling mechanisms 138. The decoupling mechanisms can accommodate movement in a radial direction (e.g., in the "x, y" plane in the figures) along a radial axis of the arms 210 while resisting movement in a direction perpendicular to the plane in which the radial arms are disposed. The decoupling mechanisms 250 can be more flexible in the radial (horizontal) direction (in the "x,y" plane in the figures) than the vertical direction (parallel to the "z" axis in the figures). As a non-limiting example, the decoupling mechanisms 250 can provide an amount of compliance in the radial direction that is greater than or equal to any of a factor of 1.5, 2, 3, 5, or 10 times the amount of compliance in the vertical direction. In other words, the decoupling mechanisms 250 can provide a vertical rigidity that is 1.5, 2, 3, 5 or 10 times the rigidity in the horizontal direction. Various types of decoupling mechanisms 250 can be used, as will now be described. Decoupling mechanism 250' located in the cardholder 142 can be structurally and functionally like decoupling mechanism 250 and can comprise any embodiment disclosed herein for decoupling mechanism 250.

In some embodiments, the decoupling mechanism (e.g., 138, 250) can comprise one or more slits within the radial arm (e.g., 133, 210). For example, FIGS. 3A-3B illustrate one embodiment of a decoupling mechanism 300 which comprises a plurality of slits 302 disposed within a radial arm 304 (which can be radial arm 133 or radial arm 210). While two slits 302 are shown, the number of slits can be 2, 3, 4, or any other suitable number. The slits 302 can be oriented substantially perpendicular to the longitudinal radial axis 306 of the radial arm 304, wherein the longitudinal axis of the radial arm extends along the length of the radial arm, from the main body (not shown) to the end (not shown) of the radial arm. The slits 302 can be narrow (e.g., 'A' dimension between 50 micrometers to 1.5 millimeters) cuts that extend partially into the radial arm 304 (e.g., between 75% to 95% of the way through the radial arm) and completely across the width (e.g., 'C' dimension) of the radial arm. For example, one of the slits 306 can extend inward into the radial arm 304 from an upper surface 306, and another one of the slits 306 can extend inward into the radial arm from a lower surface 308. The slits 302 can be closely spaced (e.g. 'B' dimension between about 500 micrometers and 5 millimeters). Various ways of fabricating the slits 302 into the radial arm 304 can be used, including for example: electron discharge machining, physical sawing, water jet cutting, laser cutting, and the like.

Figure 4:
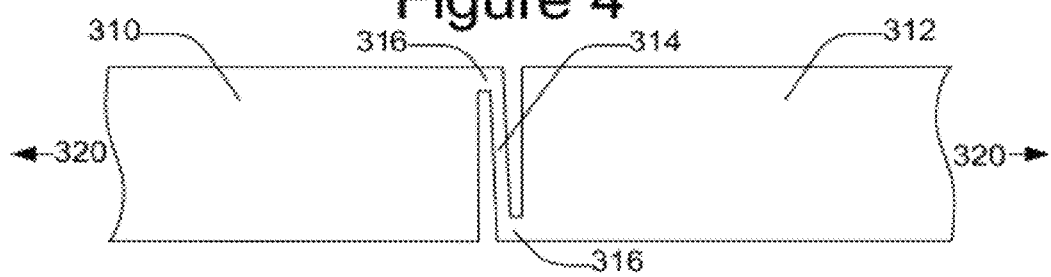
FIG. 4 is a side view of a decoupling mechanism showing the decoupling mechanism expanding in response to a radial tension force according to some embodiments of the invention.
Figure 5:
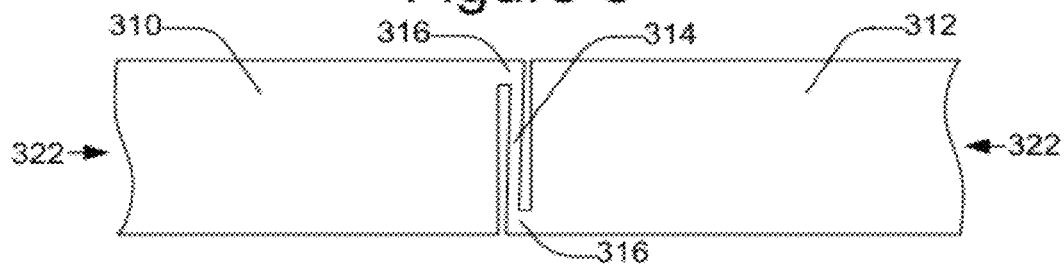
FIG. 5 is a side view of a decoupling mechanism showing the decoupling mechanism contracting in response to a radial compression force according to some embodiments of the invention.

Operation of the decoupling mechanism 300 can be understood in reference to FIGS. 4-5 which show the decoupling mechanism alternatively in an expanded position (FIG. 4) and a contracted position (FIG. 5). The decoupling mechanism 300, comprising slits 302, is positioned in between a first portion 310 (e.g. a main body side) and a second portion 312 (e.g. a distal end) of the radial arm 304. The slits 302 effectively create a beam portion 314 connected by hinge areas 316 to top of the first portion 310 and the bottom of the second portion 312. Bending at the hinge areas 316 therefore allows for radial movement of the first portion relative to the second portion (e.g., movement within the x-y plane). For example, as shown in FIG. 4, movement of the first portion 310 and the second portion 312 away from each other can be accommodated by the hinge portions 316 bending slightly to provide a slight angle to the beam portion 314. This can have the effect of increasing the length of the radial arm, for example in response to thermally-induced forces placing tension on the radial arm (e.g., a decrease in size of a stiffener relative to a cardholder to which it is fixed). Conversely, as shown in FIG. 5, movement of the first portion 310 and the second portion 312 toward each other can be accommodated by the hinge portions 312 bending in the opposite direction from that shown in FIG. 4, allowing the slits 302 to decrease in size. This can have the effect of decreasing the length of the radial arm, for example in response to thermally-induced forces placing compression on the radial arm (e.g. an increase in size of a stiffener relative to a cardholder to which it is fixed). In other words, the decoupling mechanism can have the effect of compensating for an increase or decrease in radial dimension (e.g., diameter) of the stiffener by a corresponding decrease or increase so that the overall radial dimension of the stiffener between fixed attachment points remains substantially constant (relative to the dimensions defined by the attachment points, which may also vary, for example, due to thermal effects).

Note that movements shown in FIGS. 4-5 are exaggerated for illustration, and actual radial movement can be relatively small. For example, radial expansion and contraction may be less than 500 micrometers. In general, the amount of compliance provided can be proportional to the width (A-dimension) of the slits (as well as being a function of the stiffness of the material from which the radial arm 304 is constructed) with a larger width slit generally providing greater compliance. Accordingly, the dimensions of the slits can be selected to provide a desired amount of compliance. For example, as generally discussed above with respect to decoupling mechanisms 138, the dimensions of the slits can be selected such that the amount of compliance is set so that thermally induced movement of the cardholder 142 at a given temperature is compensated for by a corresponding (e.g., approximately equal but opposite) thermally induced movement of the stiffener 202 at the given temperature over a predetermined temperature range (e.g., a desired operating temperature range). Thus, the dimensions of the slits can be selected so that the net thermally induced movement of the cardholder 142 and the stiffener 202 results in approximately zero movement of the contact ends of the probes 124 over a predetermined temperature range. This can result in no appreciable movement in the "z" directions of the plane 156 of the contact ends of the probes 124.

While the decoupling mechanism 300 can provide compliance in the radial direction (e.g., allowing expansion and contraction of the radial arm 304), the decoupling mechanism can maintain rigidity in directions other than the radial direction. In particular, the decoupling mechanism 300 can maintain rigidity in the vertical z-direction. This rigidity can be maintained because the hinge portion 316 can only readily bend in one direction (e.g., in response to axial loading along the radial axis) and does not readily bend in respond to forces oriented in other directions (e.g., forces perpendicular to the radial axis) or torsion (twisting) forces. In particular, the entire width of the radial arm 304 can essentially resist vertical (z-direction) forces (e.g., probe loading). Accordingly, a stiffener which includes decoupling mechanisms in each of the radial arms can maintain rigidity in the z-direction while being able to accommodate thermally-induced dimensional changes in the x-y plane (e.g., radial expansion/contraction). In general, the amount of rigidity maintained is proportional to the width (C-dimension) of the radial arm 304 (as well as being a function of the stiffness of the material from which the radial arm is constructed), with a wider radial arm generally providing greater rigidity.

Another embodiment of a decoupling mechanism 600 is illustrated in FIG. 6. The decoupling mechanism 600 can be disposed within the radial arm 304, and can include two slits 602, which can be oriented similarly as in FIGS. 3A-3B. The slits 602 can define a beam section 614 disposed between the slits. Within the beam section can be a hollow portion 616. For example, the hollow portion 616 can be cut into a side surface of the radial arm, and can extend partially or completely through the radial arm. The hollow portion 616 can help to allow for deformation of the beam when radial (axial) loading is applied, increasing the compliance of the decoupling mechanism 600 in the radial (axial) direction.

A decoupling mechanism can include slits in other orientations. For example, as illustrated in FIG. 7, another embodiment of a decoupling mechanism 700 can include angled slits 702 between a first portion 710 (e.g., a main body side) and a second portion 720 (e.g., a distal end) of the radial arm 304. The slits 702 can be at an angle (e.g., other than perpendicular) relative to the top surface 306 and bottom surface 308 of the radial arm 304. Angled slits 702 can provide a different ratio of radial compliance to vertical compliance as compared to perpendicularly oriented slits (e.g., 302). In some embodiments, angled slits 702 can also improve (e.g., maximize) stiffness in the vertical direction in FIG. 7 by reducing (e.g., minimizing) bending stresses in the radial arm 304. As a non-limiting example, angle offsets from vertical (perpendicular) can include 10 degrees, 22.5 degrees, 30 degrees, 45 degrees, or any other suitable value.

Figures 8A, 8B:
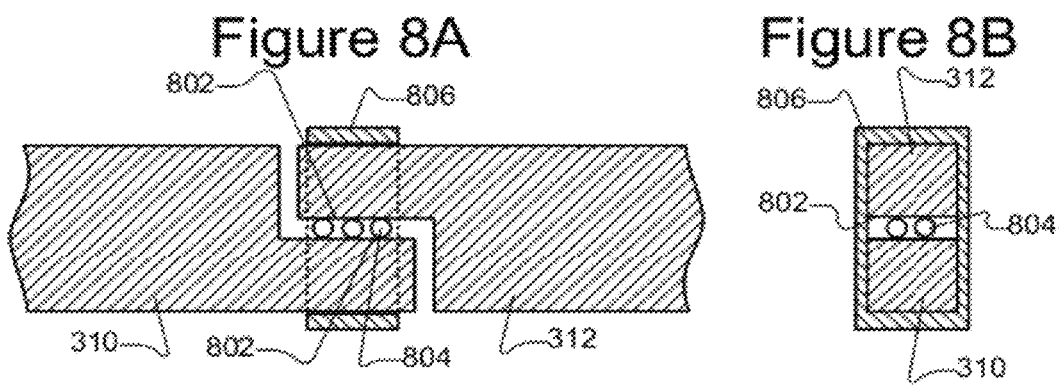
FIG. 8A is a side cross-section view of a radial arm showing another example of a decoupling mechanism according to some embodiments of the invention.
FIG. 8B is a side cross-section view of the decoupling mechanism of FIG. 8A oriented 90 degrees from the view of FIG. 8A.

Another example of a decoupling mechanism is illustrated in FIGS. 8A-8B. The decoupling mechanism can be disposed between a first portion 310 and a second portion 312 of the radial arm 304. The decoupling mechanism can include stepped portions which provide opposing bearing surfaces 802 on each of the first portion 310 and the second portion 312. Positioned between the bearing surfaces can be a bearings 804. Although four bearings are shown here, the number of bearings can be more or less than four. A clamp 806 can hold the first portion 310, second portion 312, and the bearings 804 together. The clamp can allow the first portion 310 and second portion 312 to slide radial relative to each other, while holding the first portion and second portion rigidly together in other directions.

Figure 9:
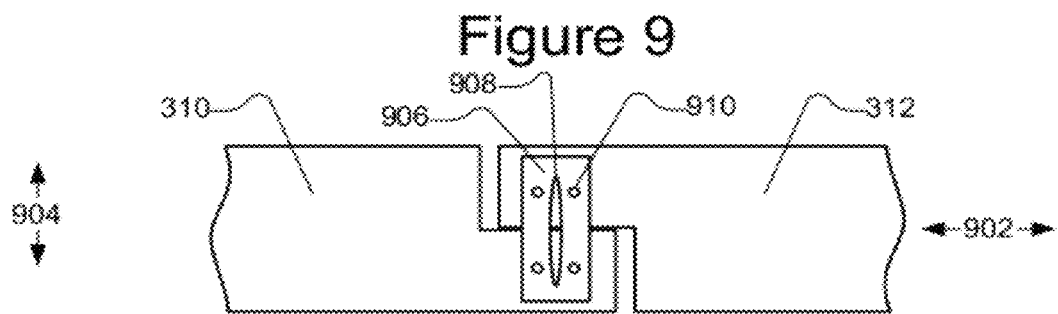
FIG. 9 is a side view of a radial arm showing another example of a decoupling mechanism according to some embodiments of the invention.

Another example of a decoupling mechanism is illustrated in FIG. 9. The decoupling mechanism can include facing stepped portions of a first portion 310 and second portion 310 of the radial arm 304. The first portion 310 and second portion 310 can be held together by a flexible connector 906 which provides compliance in the radial direction 902 and rigidity in the vertical direction 904. For example, the flexible connector can be a metal plate which has been machine to include a hole 908 to allow flexing in the radial direction while resisting flexing in the vertical direction. As another example, the flexible connector can be a material which has compliance characteristics that differ in different directions. The flexible connector 906 can be attached to the radial arm portions, for example, by pins 910 which pass through corresponding holes in the flexible connector. As another example, the flexible connector can be a material which provides different rigidity in different directions.

Probe card assemblies (e.g., 124, 200) with stiffeners (e.g., 120, 202) having decoupling mechanisms (e.g., 138, 250, 300, 600, 700) as described herein can be used to provide reduced thermal motion of the probe card. A probe card assembly can be installed into a prober (e.g., 102) by fixing attachment mechanisms (e.g., 136, 206) of the probe card assembly to a cardholder (e.g., 142) of the prober. Once installed, the prober can be operated to bring the probes (e.g., 124, 224) into contact with a device to be tested (e.g., DUT 112). Typically, the probes make contact with terminals of the device with some minimal contact force (e.g., by additional movement or over-travel past the point of initial contact) to provide reliable electrical connections between the probes and the device. This can result in forces on the probes, which are communicated through the probe head to the stiffener. The stiffener can resist deformation by these forces. Once the electrical connections have been made, testing can proceed by communicating test signals through the probes to the device to be tested. Testing can include providing stimulus signals to the device to be tested and receiving response signals from the device to be tested. Response signals can be compared to an expect response to determine if the device to be tested is operating correctly.

During testing, temperature of the probe card assembly can be varied either intentionally or unintentionally, via direct or indirect heating or cooling. For example, heating or cooling of the stage on which the device to be tested is position can result in indirect heating or cooling of the probe card assembly. Variation in temperature of the probe card assembly can cause a dimensional change of the probe card assembly relative to the cardholder. For example, the probe card assembly can have a different coefficient of thermal expansion as compared to the coefficient of thermal expansion of the cardholder. As another example, the probe card assembly and the cardholder can be at different temperatures. The decoupling mechanisms can absorb these dimensional changes and differences, helping to reduce thermally-induced forces on the stiffener. This can help the stiffener to maintain the probes in a substantially constant position within the z plane.

Also, generally in accordance with the discussion above with respect to slits shown in FIGS. 4-5, any of the decoupling mechanisms disclosed herein can be configured to provide an amount of compliance in the probe card assembly that results in thermally induced movement in the probe card assembly at a given temperature that sufficiently offsets thermally induced movement of the cardholder at the given temperature over a predetermined temperature range to maintain contact ends of the probes in a plane. For example, any of the decoupling mechanisms 138 (or 138'), 250 (or 250'), 300, 600, 700, and/or the decoupling mechanisms illustrated in FIGS. 8A, 8B, and 9 can be configured to have an amount of compliance such that thermally induced movement of the cardholder 142 at a given temperature is sufficiently offset by thermally induced movement of the stiffener (e.g., 202) of the probe card assembly at the given temperature over a predetermined temperature range (e.g., a desired operating temperature range) to maintain contact ends of the probes in the plane 156 and keep the plane 156 from moving. The net thermally induced movement of the cardholder 142 and the probe card assembly can thus be configured such that the net movement of the contact ends of the probes 124 (and thus the plane 156) is substantially zero over a predetermined temperature range.

In accordance with additional embodiments of the invention, decoupling mechanisms as disclosed herein can alternatively or in addition be provided in other portions of the test system. For example, referring to FIG. 1A, in some embodiments, decoupling mechanisms (not shown) can be included within the cardholder 142 in addition to or instead of the decoupling mechanisms 138 within the probe card assembly 108. For example, the decoupling mechanisms can be disposed within the card holder between the holes 144 and a main portion of the card holder (e.g., between the holes and other structure (not shown) of the cardholder attached to or held by the prober). The decoupling mechanisms can be like any of the decoupling mechanisms disclosed above. As a particular example, the decoupling mechanisms shown in FIGS. 6-9 can be used (e.g., the first portion 310 can be a first portion of the cardholder 142 and the second portion 312 can be a second portion of the card holder).

As another example, decoupling mechanisms can be used for attachment of the probe card assembly 108 to the card holder 142. For example, in place of fasteners 146 a decoupling mechanism (not shown) can be used to attach the probe card assembly 108 to the card holder 142. The decoupling mechanisms can be like any of the decoupling mechanisms shown above. As a particular example, the decoupling mechanisms shown in FIGS. 8A-8B and 9 can be used (i.e., the first portion 310 can be a probe card assembly and the second portion 312 can be an insert ring, or vice versa).

As will now be apparent, some embodiments of a stiffener and probe card assembly as disclosed herein can provide several advantages. In some embodiments, the decoupling mechanisms can be implemented as partial cuts into the arms of the stiffener, hence the stiffener can be a single piece, and few or no additional parts or tooling may be needed for handling the stiffener or assembling the probe card assembly. In some embodiments, the CTE of the stiffener need not match the CTE of the cardholder, hence less expensive materials can be used to fabricate the stiffener. In some embodiments, the same probe card design can provide low thermally-induced movement even when used in different types of probers which include cardholders made of different materials having differing CTE.

Although specific embodiments and applications of the invention have been described in this specification, these embodiments and applications are exemplary only, and many variations are possible. Accordingly, there is no intention that the invention be limited to these exemplary embodiments and applications or to the manner in which the exemplary embodiments and applications operate or are described herein. For example, features shown in one embodiment can be combined with features shown in another embodiment. Accordingly, it is not intended that the invention be limited except as by the claims set forth below.

We claim:

1. A probe card assembly, comprising:
   a wiring substrate comprising a first surface, an opposed second surface, and a plurality of internal electrical traces;
   a tester interface disposed on said first surface of said wiring substrate and electrically connected to said plurality of internal electrical traces;
   a probe head disposed proximate to said second surface of said wiring substrate, said probe head comprising a plurality of probes disposed thereon and arranged to contact an electronic device to be tested, said probe head further comprising a plurality of electrical connections between said plurality of probes and said internal electrical traces;
   a stiffener disposed proximate to said first surface, said stiffener comprising a main body coupled to said probe head and said stiffener comprising a plurality of attachment mechanisms disposed distally from said main body; and
   a plurality of decoupling mechanisms disposed radially between said main body and said attachment mechanisms, each said decoupling mechanism being sufficiently compliant in a radial direction to move in said radial direction and sufficiently rigid in at least one other direction to resist moving in said at least one other direction,
   wherein said stiffener comprises a plurality of radial arms extending radially outward from said main body to a corresponding one of said attachment mechanisms and each said decoupling mechanism is disposed in a corresponding one of said radial arms, and
   wherein each said decoupling mechanism allows a first portion of said corresponding radial arm to move away from and toward a second portion of said radial arm.

2. The probe card assembly of claim 1, wherein said decoupling mechanism accommodates radial changes in dimension of said stiffener relative to a cardholder to which said attachment mechanisms are attached.

3. The probe card assembly of claim 1, wherein each said decoupling mechanism enables movement of said corresponding radial arm in a direction aligned with a longitudinal axis of said radial arm and resists movement in a direction perpendicular to said longitudinal axis.

4. The probe card assembly claim 1, wherein said radial arms are removably attached to said main body.

5. The probe card assembly of claim 1, wherein said decoupling mechanism is configured to provide an amount of compliance such that thermally induced movement of said stiffener offsets sufficiently thermally induced movement of a cardholder to which said probe card assembly is attached that contact ends of said probes stay substantially in a stationary plane over a predetermined temperature range.

6. The probe card assembly of claim 1, wherein said attachment mechanism comprises a hole sized to receive a bolt for engagement with a cardholder of a prober.

7. The probe card assembly of claim 1, wherein:
said second portion of said corresponding radial arm extends from said main body to said decoupling mechanism, and
said first portion of said corresponding radial arm extends from said decoupling mechanism to said corresponding attachment mechanism.

8. The probe card assembly of claim 1, wherein each said decoupling mechanism comprises:
ball bearings disposed between said first portion and said second portion, or
a flexible connector connecting said first portion and said second portion.

9. A stiffener for use with a probe card assembly, said stiffener comprising:
a main body portion;
a plurality of first attachment mechanisms disposed on said main body portion and positioned for attachment to a probe card substrate;
a plurality of radial arms disposed within a plane and extending radially outward from said main body portion and each having a second attachment mechanism disposed proximate to an end of said arm distal from said main body portion for attachment to a cardholder of a prober;
a plurality of decoupling mechanisms each disposed within a corresponding one of said plurality of arms between said main body portion and said second attachment mechanism, wherein each said decoupling mechanism is sufficiently compliant to move in a radial direction along a radial axis of said arm, and each said decoupling mechanism is sufficiently rigid to resist moving in a direction perpendicular to said plane,
wherein each said decoupling mechanism allows a first portion of said corresponding radial arm to move away from and toward a second portion of said radial arm.

10. The stiffener of claim 9, wherein each said decoupling mechanism comprises:
ball bearings disposed between said first portion and said second portion, or a flexible connector connecting said first portion and said second portion.

11. A probe card assembly, comprising:
a wiring substrate comprising a first surface, an opposed second surface, and a plurality of internal electrical traces;
a tester interface disposed on said first surface of said wiring substrate and electrically connected to said plurality of internal electrical traces;
a probe head disposed proximate to said second surface of said wiring substrate, said probe head comprising a plurality of probes disposed thereon and arranged to contact an electronic device to be tested, said probe head further comprising a plurality of electrical connections between said plurality of probes and said internal electrical traces;
a stiffener disposed proximate to said first surface, said stiffener comprising a main body coupled to said probe head and said stiffener comprising a plurality of attachment mechanisms disposed distally from said main body; and
a plurality of decoupling mechanisms disposed radially between said main body and said attachment mechanisms, each decoupling mechanism being compliant in a radial direction and rigid in at least one other direction, wherein
said stiffener comprises a plurality of radial arms extending radially outward from said main body and one of said decoupling mechanisms is disposed in each of said radial arms, and
said decoupling mechanism comprises a slit disposed within said radial arm.

12. The probe card assembly claim 11, wherein said decoupling mechanism comprises a plurality of slits disposed within said radial arm.

13. The probe card assembly of claim 12, wherein each of said plurality of slits is oriented substantially perpendicular to said longitudinal axis of said radial arm.

14. The probe card assembly of claim 12, wherein each of said plurality of slits is oriented at an angle relative to a surface of said radial arm.

15. The probe card assembly of claim 12, wherein said plurality of slits define a beam between said plurality of slits, and said beam comprises a hollow portion.

16. The probe card assembly of claim 12, wherein a first one of said plurality of slits extends inward from a first surface of said plurality of radial arms, and a second one of said plurality of slits extends inward from a second surface of said plurality of radial arms, said second surface opposite and parallel to said first surface.

17. The stiffener of claim 9, wherein:
said second portion of said corresponding radial arm extends from said main body to said decoupling mechanism, and
said first portion of said corresponding radial arm extends from said decoupling mechanism to said distal end of said corresponding radial arm.

18. The stiffener of claim 9, wherein said decoupling mechanism accommodates radial changes in dimension of said stiffener relative to a mounting structure to which said second attachment mechanisms are attached.

19. The stiffener of claim 9, wherein said stiffener comprises any of:
aluminum, steel, stainless steel, low-CTE nickel-steel alloy, and combinations thereof.

20. The stiffener of claim 9, wherein said first attachment mechanism comprises a threaded hole for receiving a differential screw for adjusting a position of said probe head relative to said stiffener.

21. The stiffener of claim 9, wherein said second attachment mechanism comprises a through hole for receiving a bolt for engagement into a cardholder of a prober.

22. A stiffener for use with a probe card assembly, said stiffener comprising:
a main body portion;
a plurality of first attachment mechanisms disposed on said main body portion and positioned for attachment to a probe card substrate;
a plurality of radial arms disposed within a plane and extending radially outward from said main body portion and each having a second attachment mechanism disposed proximate to an end of said arm distal from said main body portion for attachment to a cardholder of a prober;
a decoupling mechanism disposed within each of said plurality of arms between said main body portion and said second attachment mechanism, wherein said decoupling mechanism accommodates movement in a radial direction along a radial axis of said arm, and said decoupling mechanism resists movement in a direction perpendicular to said plane,
wherein said decoupling mechanism comprises a slit disposed within said radial arm.

23. The stiffener of claim 22, wherein said decoupling mechanism comprises a plurality of slits disposed within said radial arm.

24. The stiffener of claim 23, wherein each of said plurality slits is oriented substantially perpendicular to a longitudinal axis of said radial arm.

25. The stiffener of claim 23, wherein said plurality of slits define a beam portion between said slits, and said beam portion comprises a hollow portion.

26. The stiffener of claim 23, wherein said plurality of slits extend from opposing sides of said radial arm into said radial arm.

* * * * *